(12) United States Patent
Ho et al.

(10) Patent No.: US 9,184,117 B2
(45) Date of Patent: Nov. 10, 2015

(54) STACKED DUAL-CHIP PACKAGING STRUCTURE AND PREPARATION METHOD THEREOF

(71) Applicants: Yueh-Se Ho, Sunnyvale, CA (US); Yan Xun Xue, Los Gatos, CA (US); Hamza Yilmaz, Saratoga, CA (US); Jun Lu, San Jose, CA (US)

(72) Inventors: Yueh-Se Ho, Sunnyvale, CA (US); Yan Xun Xue, Los Gatos, CA (US); Hamza Yilmaz, Saratoga, CA (US); Jun Lu, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 155 days.

(21) Appl. No.: 13/663,694

(22) Filed: Oct. 30, 2012

(65) Prior Publication Data

US 2014/0117523 A1 May 1, 2014

(51) Int. Cl.
*H01L 29/40* (2006.01)
*H01L 23/495* (2006.01)
(Continued)

(52) U.S. Cl.
CPC ...... *H01L 23/4952* (2013.01); *H01L 23/49562* (2013.01); *H01L 24/14* (2013.01); *H01L 24/37* (2013.01); *H01L 24/40* (2013.01); *H01L 21/6835* (2013.01); *H01L 23/3107* (2013.01); *H01L 23/3142* (2013.01); *H01L 24/11* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 24/84* (2013.01); *H01L 2221/68327* (2013.01); *H01L 2224/1134* (2013.01); *H01L 2224/131* (2013.01); *H01L 2224/136* (2013.01); *H01L 2224/1308* (2013.01); *H01L 2224/13082* (2013.01); *H01L 2224/13111* (2013.01); *H01L 2224/13144* (2013.01); *H01L 2224/13147* (2013.01); *H01L 2224/13794* (2013.01); *H01L 2224/13839* (2013.01); *H01L 2224/1403* (2013.01); *H01L 2224/16245* (2013.01);
(Continued)

(58) Field of Classification Search
CPC .............. H01L 23/4012; H01L 25/043; H01L 25/0657; H01L 25/117; H01L 2225/06517; H01L 21/67144; H01L 23/047; H01L 23/48; H01L 23/495; H01L 23/4951
USPC ......... 257/665, 676, 666, 678, 692, 734, 777, 257/778, E25.001, E25.006, E24.013, 257/E25.021, E25.027, E23.068, E23.085, 257/E23.187, E23.186, E21.511; 438/106, 438/108, 123
See application file for complete search history.

(56) References Cited

U.S. PATENT DOCUMENTS 6,051,887 A * 4/2000 Hubbard ........................ 257/777
7,071,033 B2 * 7/2006 Estacio ........................... 438/123
(Continued)

*Primary Examiner* — Galina Yushina
(74) *Attorney, Agent, or Firm* — Chein-Hwa S. Tsao; Chen-Chi Lin

(57) ABSTRACT

The invention relates to a power semiconductor device and a preparation method, particularly relates to preparation of stacked dual-chip packaging structure of MOSFET (Metal-Oxide-Semiconductor Field Effect Transistor) using flip chip technology with two interconnecting plates. The first chip is flipped and attached on the base such that the first chip is overlapped with the third pin; the back metal layer of the first chip is connected to the bonding strip of the first pin through a first interconnecting plate; the second chip is flipped and attached on a main plate portion of the first interconnecting plate such that the second chip is overlapped with the fourth pin; and the back metal layer of the second chip is connected to the bonding strip of the second pin through the second interconnecting plate.

18 Claims, 14 Drawing Sheets

(51) Int. Cl.
    *H01L 23/31*      (2006.01)
    *H01L 23/00*      (2006.01)
    *H01L 21/683*     (2006.01)

(52) U.S. Cl.
    CPC ... *H01L2224/293* (2013.01); *H01L 2224/2929* (2013.01); *H01L 2224/32245* (2013.01); *H01L 2224/37011* (2013.01); *H01L 2224/37013* (2013.01); *H01L 2224/405* (2013.01); *H01L 2224/40245* (2013.01); *H01L 2224/40248* (2013.01); *H01L 2224/40499* (2013.01); *H01L 2224/73253* (2013.01); *H01L 2224/73255* (2013.01); *H01L 2224/8185* (2013.01); *H01L 2224/81191* (2013.01); *H01L 2224/81801* (2013.01); *H01L 2224/83851* (2013.01); *H01L 2224/8485* (2013.01); *H01L 2224/92225* (2013.01); *H01L 2224/92226* (2013.01); *H01L 2924/1306* (2013.01); *H01L 2924/13091* (2013.01)

(56) References Cited

U.S. PATENT DOCUMENTS

| | | | |
|---|---|---|---|
| 2007/0108575 A1* | 5/2007 | Montgomery | 257/678 |
| 2007/0284720 A1* | 12/2007 | Otremba et al. | 257/690 |
| 2008/0224300 A1* | 9/2008 | Otremba | 257/693 |
| 2009/0130799 A1* | 5/2009 | Havanur | 438/109 |

* cited by examiner

A-A

B-B

C-C

STACKED DUAL-CHIP PACKAGING STRUCTURE AND PREPARATION METHOD THEREOF

CROSS-REFERENCE TO RELATED APPLICATIONS

This Patent Application is a Continuation in Part (CIP) Application of a co-pending application Ser. No. 12/819,111 filed on Jun. 18, 2010 by a common inventor of this Application. The Disclosure made in the patent application Ser. No. 12/819,111 is hereby incorporated by reference.

FIELD OF THE INVENTION

The invention relates to a power semiconductor device and a preparation method, particularly relates to preparation of a stacked Dual-chip packaging structure of MOSFETs (Metal-Oxide-Semiconductor Field Effect Transistors) using flip chip technology and two additional interconnecting plates.

DESCRIPTION OF THE RELATED ART

With the trend of reducing chip size in the semiconductor device, the thermal conductivity of the semiconductor device plays a role in improving semiconductor technology and device performance. It is a challenge for semiconductor industry how to make a minimum size semiconductor package with a maximum size chip. Especially, for certain chips with large power consumption, such as DC-DC device, N type high-side and low-side transistors are packaged into a same package.

FIG. 1 and FIGS. 2A-2E are schematic diagrams of a stacked dual-chip package of the prior art. FIG. 1 is a top view diagram of a package 10. FIG. 2A is a cross-sectional structure diagram of a package 10 along A-A line in FIG. 1. FIG. 2B is a cross-sectional structure diagram of the package 10 along B-B line in FIG. 1, and FIG. 2C is a cross-sectional structure diagram of the package 10 along C-C line in FIG. 1. As shown in FIG. 1 and FIGS. 2A-2C, top metal sheets 11a and 11b are electrically connected with electrodes at the front side of a first chip 15 and can be used as electrode leading-out terminal and also for heat dissipation. Metal sheets 12a and 12b in FIGS. 2B-2C are located below the first chip 15 and are electrically connected to electrodes at the back side of the first chip 15 and electrodes at the front side of a second chip 16. The electrode at the back side of the second chip 16 is attached on a metal sheet 13 served as a terminal for connecting the electrode at the back side of the chip 16 to the outside circuit and also served as a heat sink. FIG. 2E is a bottom view diagram of the package 10. Pins 13a, 13b, 13c and 13d are formed around the metal sheet 13 with the pin 13a connected with the metal sheet 13. As shown in FIG. 2C, pins 13b and 13d are attached to the metal sheets 11a and 11b through extending parts 13e and 13f extending upwards to the plane of the metal sheet 12a. For the sake of simplicity, the bonding materials for attaching the electrode of the first chip 15 to the metal sheets 11a, 11b and 12a and attaching the electrode of the second chip 16 to the metal sheets 12a, 12b and 13a are not shown in FIGS. 2A-2C.

In addition, the metal sheet 11a is higher than the metal sheet 11b such that the metal sheet 11a and the metal sheet 11b are not located in the same plane. Therefore, in a top view diagram of the package 10 shown in FIG. 2D, the metal sheet 11b is encapsulated inside the package 10, while the top surface of the metal sheet 11a exposes outside the plastic package body of the package 10. In FIG. 2B, the metal sheet 12b is lower than the metal sheet 12a to avoid the metal sheet 12b from contacting the back side of the first chip 15.

However, a lead frame used for stacking two chips as shown in FIGS. 1 and 2A-2E is complicated and a large amount of metal sheets is required. Therefore, the preparation process is difficult to achieve and the reliability is extremely low, and the volume of the final package is also very large.

Based on these problems, various embodiments of the invention are proposed.

BRIEF DESCRIPTION OF THE DRAWINGS

As shown in attached drawings, the embodiment of the invention is more sufficiently described. However, the attached drawings are only used for explaining and illustrating rather than limiting the scope of the invention.

FIG. 4F-1 to FIG. 4F-2 shows a technique of forming a long interconnection structure on the fourth electrode at the front surface of the second chip.

DETAILED DESCRIPTION OF THE PREFERRED EMBODIMENTS

Figure 3A:
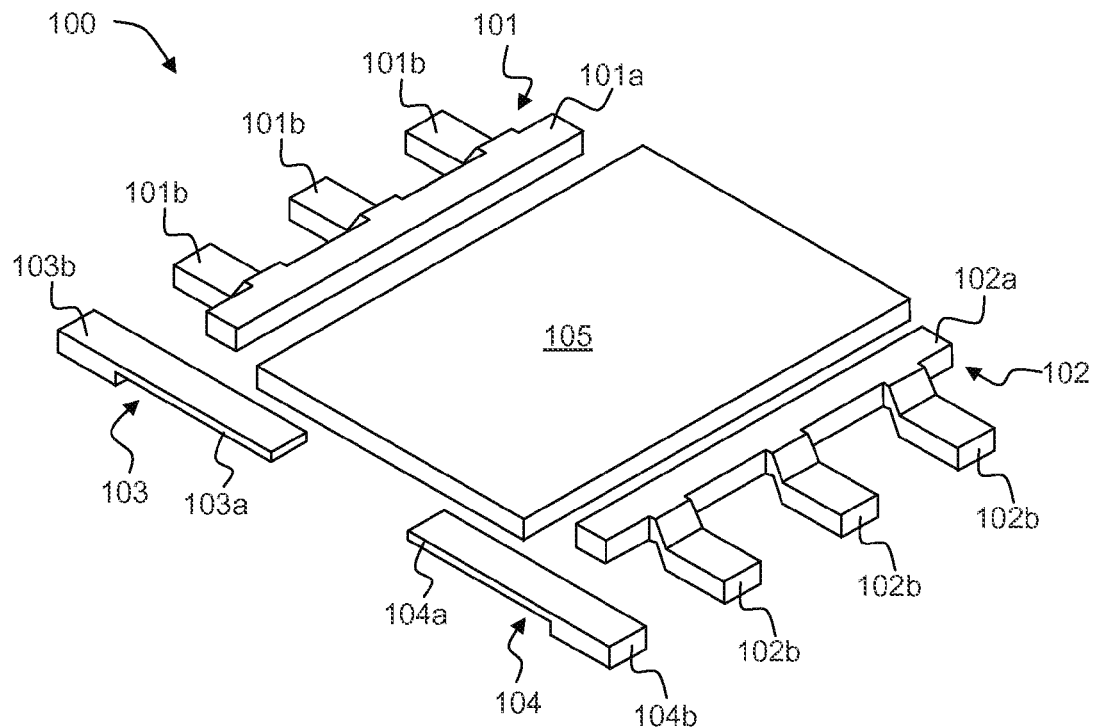
FIG. 3A to FIG. 3E are schematic diagrams illustrating of a process of forming stacked dual-chip semiconductor device in the invention.
Figure 3B:
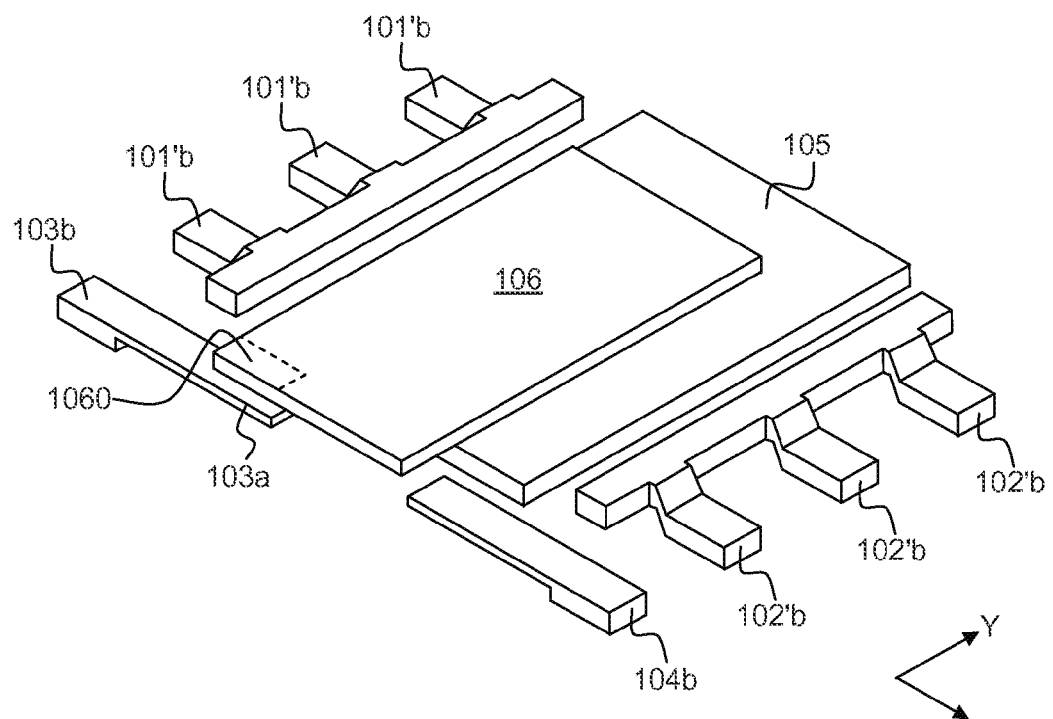

As shown in FIG. 3A, the lead frame 100 includes a rectangular base 105, a first pin 101, a second pin 102, a third pin 103 and a fourth pin 104 arranged close to the base 105, where the first pin 101 and the second pin 102 are arranged at two opposite sides, referred at left and right sides, of the base respectively and the third pin 103 and the fourth pin 104 are arranged at one side, referred as a rear side, of the base 105. For convenience of description, an X-Y-Z Cartesian coordinates with X-Y plane parallel to the major base plane and Z-axis pointing upwards (not shown) is adopted. Specifically, as shown in FIG. 3B, X axis represents transverse direction and Y axis represents longitudinal direction. The 'front direction' is positive direction of the Y axis and the 'rear direction' is the negative direction of the Y axis. In FIG. 3A and FIG. 3B, the first pin 101 includes a bonding strip 101a extending along the direction parallel to the left side edge of the base 105 and a plurality of pin parts 101b connecting to the bonding strip 101a. Each pin part 101b bends down and then extends horizontally to form an outer pin 101'b, therefore, the bonding strip 101a is in a plane higher than that of the outer pin 101'b. The second pin 102 has a similar structure as the first pin 101, which includes a bonding strip 102a and a plurality of pin parts 102b connecting to the bonding strip 101a, each of which bends down and then extends horizontally to form an outer pin 102'b. The first and second pins 101 and 102 can be formed by stamping or pressing a metal plate.

The third pin 103 includes an outer pin 103b and an inner pin 103a transversely extending along the direction parallel to the rear side edge of the base 105, where the inner pin 103a is thinner than the outer pin 103b. Similarly, the fourth pin 104 includes an outer pin 104b and an inner pin 104a transversely extending along the direction parallel to the rear side edge of the base 105, where the inner pin 104a is thinner than the outer pin 104b. The inner pin 103a of the third pin 103 and the inner pin 104a of the fourth pin 104 extended toward each other through the center line between the left side and the right side of the base with the top surfaces of the inner pins 103a and 104a being coplanar with the front surface of the base 105. In FIGS. 3A and 3B, the outer pins 101'b and the outer pin 103b are arranged in parallel, and the outer pin 104b and the outer pins 102'b are arranged in parallel, where the outer pins 101'b, 103b, 104b and 102'b and the base 105 are located in the same plane.

Referring to FIG. 3B, the first chip 106 is flipped and attached on the base 105 such that the first chip 106 extends over an edge of the rectangular base 105 adjacent to the third pin 103 and fourth pin 104 and is partially overlapped with the inner pin 103a of the third pin 103 defining an overlapping area 1060 in the first chip 106 but is not overlapped with the fourth pin 104.

Figure 4A:
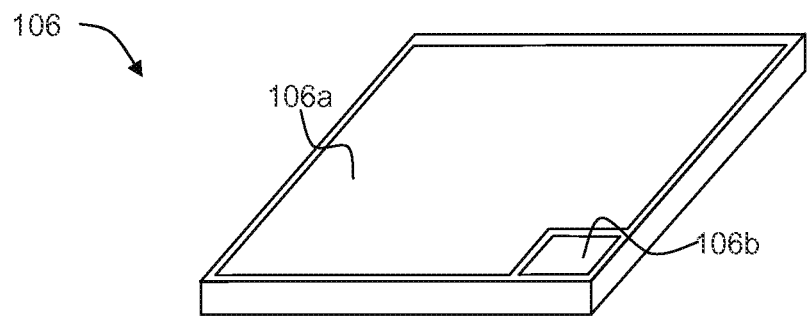
FIG. 4A to FIG. 4C are schematic diagrams illustrating the first chip with and without the interconnection structures or the plastic package layer.
Figure 4B:
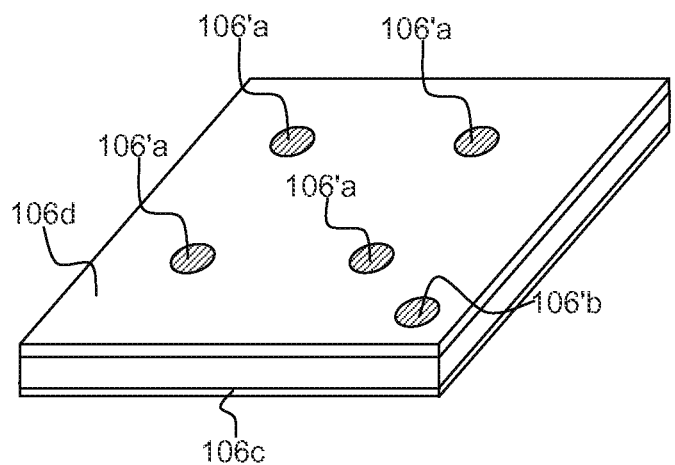
Figure 4C:
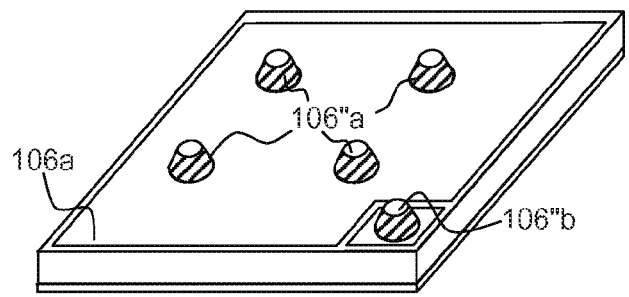

An example structure of the first chip 106 is shown in FIGS. 4A-4C. In this embodiment, the first chip 106 is a vertical MOSFET with the current flows from the front side to the back side of the chip or vice versa. As shown in FIG. 4A, the first chip 106 includes a first electrode 106a, as a source electrode, and a second electrode, as a gate electrode, on its front surface. The first electrode 106a has to carry larger current, so it has larger contact area than that of the second electrode. In one preferred embodiment, a plurality of interconnection structures 106'a are formed on the first electrode 106a at the front surface of the first chip 106, and one interconnection structure 106'b is formed on the second electrode 106b. Then, a plastic package layer 106d is formed at the front surface of the first chip 106. The plastic package layer 106d is only covered around the side wall of the interconnection structures 106'a and 106'b, so that both the interconnection structures 106'a and 106'b expose out of the plastic package layer 106d as the contact terminals. A back metal layer 106c, as a drain electrode, is formed at the back surface of the first chip 106. In FIG. 4C, there is no plastic package layer formed at the front surface of the first chip 106. The plastic package layer 106d supports mechanical strength for the wafer so that the wafer can be ground thinner in the grinding step at the wafer level to reduce substrate resistance Rdson. In the alternative embodiments, the interconnection structures 106'a, 106'b, 106"a and 106"b can be cylindrical, spherical or wedge-shaped metal bump (such as Au and Cu), or common solder balls and the like.

Referring back to FIG. 3B, after the first chip 106 is flip-chip mounted on the base 105, the second electrode 106b at the front surface of the overlapping area 1060 therefore is attached to front surface of the inner pin 103a such that the interconnection structure 106'b (FIG. 4B) or 106"b (FIG. 4C) formed on the second electrode 106b is aligned with and attached to the inner pin 103a, while the plurality of interconnection structures 106'a (FIG. 4B) or 106"a (FIG. 4C) formed on the first electrode 106a are attached on the front surface of the base 105. If the interconnection structures are made of solder-like materials containing tin and lead, the interconnection structures can be directly attached on the inner pin 103a and the base 105 by heating. If the interconnection structures are made of non-solder type metal bumps, the interconnection structures are electrically and mechanically connected to the inner pin 103a and the base 105 using a binder (not shown), such as auxiliary conductive silver paste or solder paste.

Figure 3C:
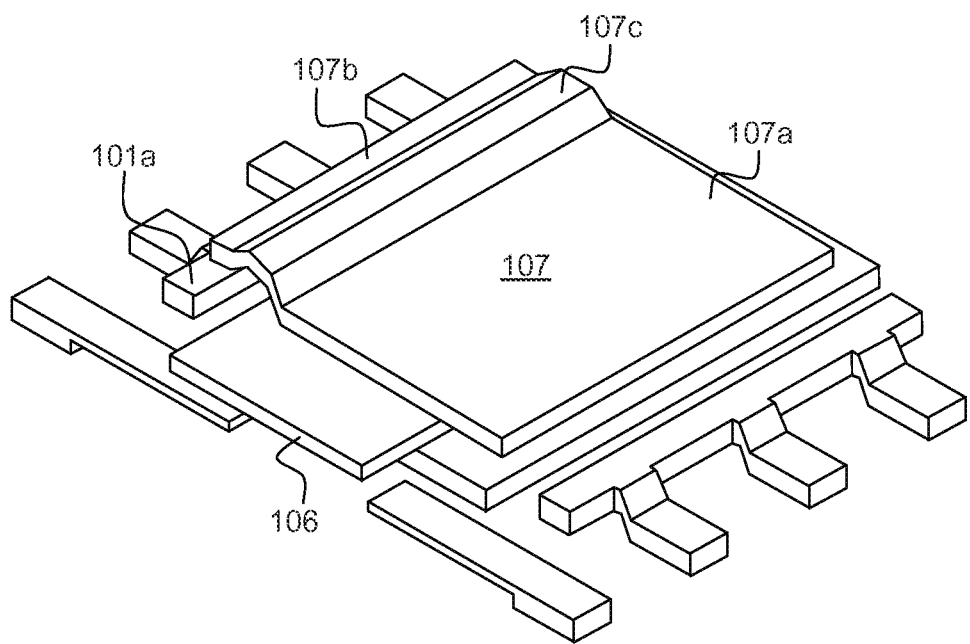
Figure 9:
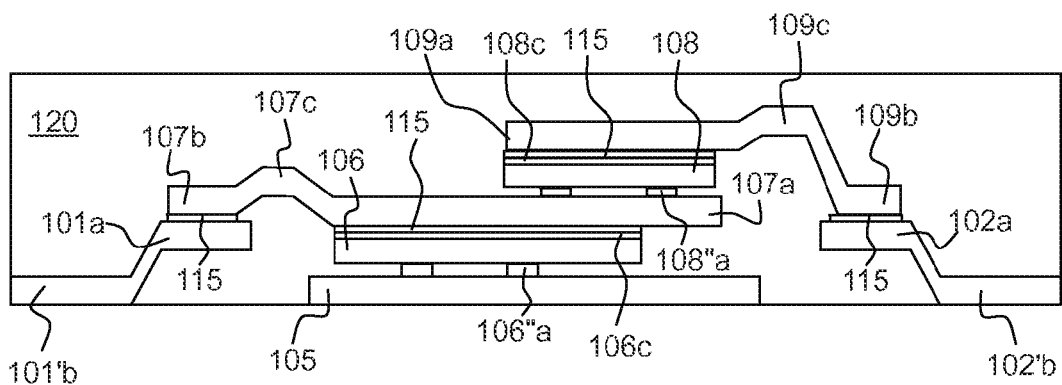
FIG. 9 is a cross-sectional diagram of a complete package of the stacked dual-chip semiconductor device of FIG. 3E.

Referring to FIG. 3C, a binder, such as a conductive adhesive, is coated on the top surface of the bonding strip 101a of the first pin 101 and the back metal layer 106c of the first chip 106, and then a first interconnecting plate 107 is attached to the back metal layer 106c and the bonding strip 101a. A binder 115 is shown in FIG. 9. The first interconnecting plate 107 includes a bridge portion 107c, and a main plate portion 107a and a sub-plate portion 107b located at the two sides of the bridge portion 107c, where the main plate portion 107a is attached on the first chip 106 with the bottom surface of the main plate portion 107a attached to the back metal layer 106c through the binder, while the sub-plate portion 107b is attached on the bonding strip 101a with the bottom surface of the sub-plate portion 107b is attached on the top surface of the bonding strip 101a through the binder. The main plate portion 107a and the sub-plate portion 107b with the bridge portion 107c form the step structures in order to attach to the first chip 106 and the bonding strip 101a respectively. Preferably the free end of the main plate portion 107a opposite the sub-plate portion 107b extends beyond the edge of the first chip 106 opposite the bonding strip 101a.

Figure 3D:
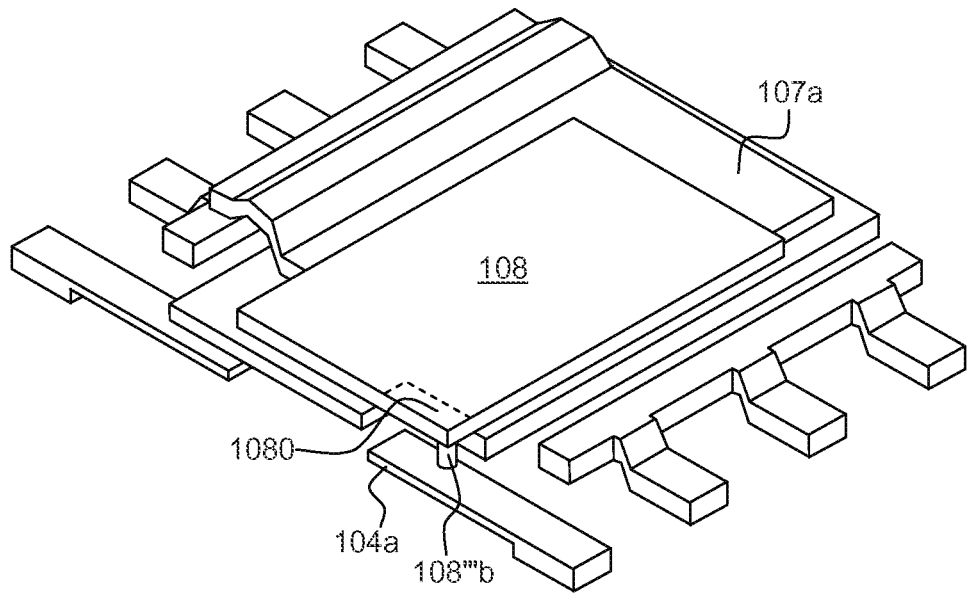

Referring to FIG. 3D, the second chip 108 is flipped and attached on the main plate portion 107a of the first interconnecting plate 107 such that the second chip 108 extends over edges of the rectangular base 105 and the first interconnecting plate 107 adjacent to the third pin 103 and fourth pin 104 and is partially overlapped with the inner pin 104a of the fourth pin 104 defining an overlapping area 1080 in the second chip 108.

Figure 4D:
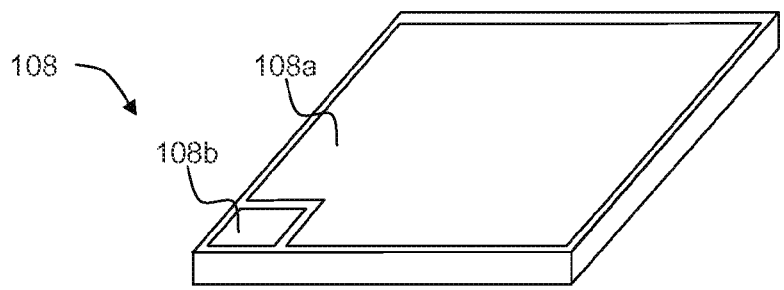
FIG. 4D to FIG. 4E are schematic diagrams illustrating the second chip with and without the interconnection structures or the plastic package layer.
Figure 4E:
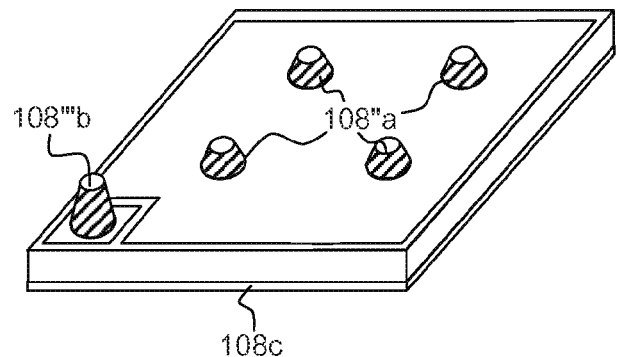

An example structure of the second chip 108 is shown in FIGS. 4D-4E. The second chip 108 is also a vertical MOSFET referred as a high-side MOSFET, while the first chip 106 is referred as a low-side MOSFET in the switching circuits such as a synchronous buck converter or half-bridge inverter and the like. As shown in FIG. 4D, the second chip 108 includes a third electrode 108a formed at its front surface of the second chip 108 as a source electrode having larger contact area, a fourth electrode 108b formed at its front surface as a gate electrode having a smaller contact area, and a back metal layer 108c as a drain electrode formed at the back surface of the second chip 108. In one embodiment, a plurality of interconnection structures 108"a are formed on the third electrode 108a, and one interconnection structure 108'''b is formed on the fourth electrode 108b. Referring to FIGS. 3D and 4E, as the top surface of the inner pin 104a of the fourth pin 104 is coplanar with the front surface of the base 105, the fourth electrode 108b located at the front surface of the overlapping area 1080 is not directly connected to the top surface of the inner pin 104*a* because there is gap between them. Therefore, for electrically connecting the fourth electrode 108*b* and the inner pin 104*a*, an interconnection structure 108'''*b* is formed along the vertical direction which must be longer than the interconnection structure 108"*a* (FIG. 4E).

In FIG. 3D, after the second chip 108 is flipped and attached on the main plate portion 107*a* of the interconnecting plate 107, the fourth electrode 108*b* is located at the front surface of the overlapping area 1080 of the second chip 108, and the interconnection structure 108'''*b* is positioned between the fourth electrode 108*b* and the inner pin 104*a* of the fourth pin 104 for connecting the fourth electrode 108*b* and the inner pin 104*a*. The plurality of interconnection structures 108"*a* (FIG. 4E) formed on the third electrode 108*a* are connected on the top surface of the main plate portion 107*a* of the interconnecting plate 107.

Figure 1:
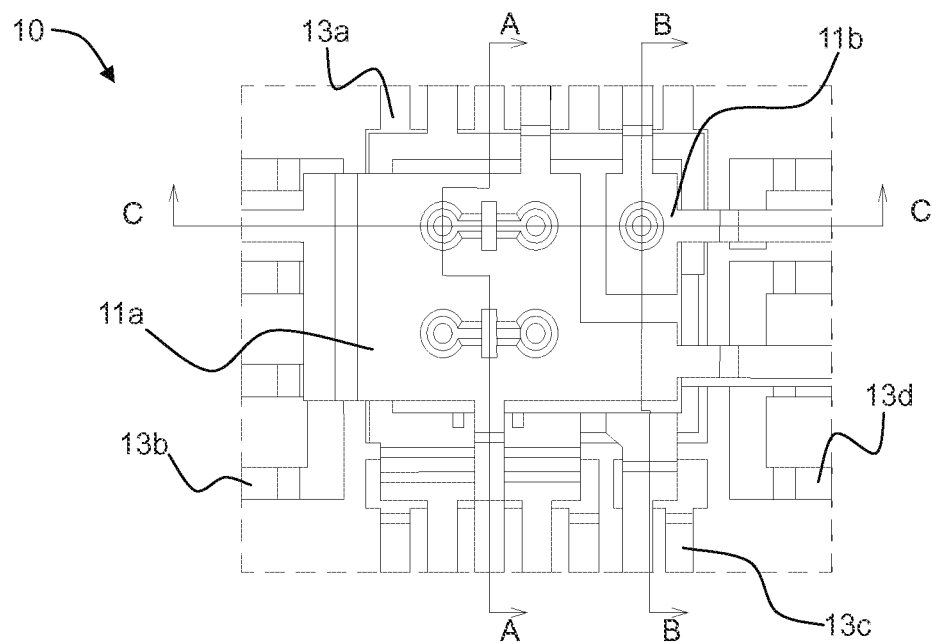
FIG. 1 to FIG. 2E are schematic diagrams of stacked dual-chip semiconductor device of the prior art.
Figure 2A:
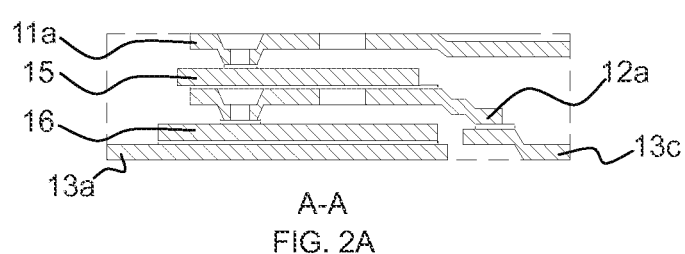
Figure 2B:
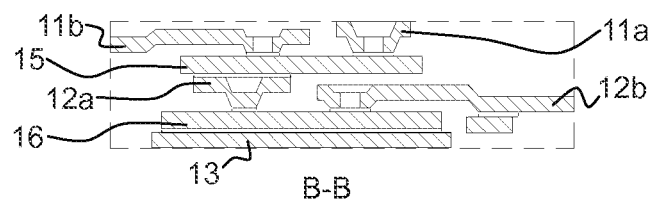
Figure 2C:
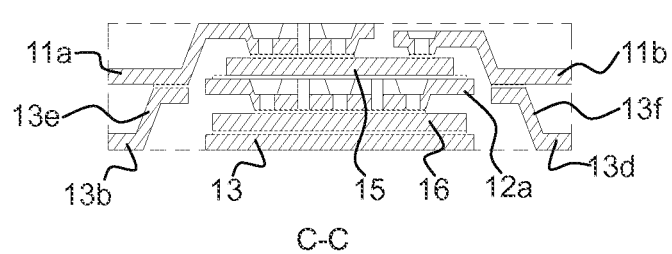
Figure 2D:
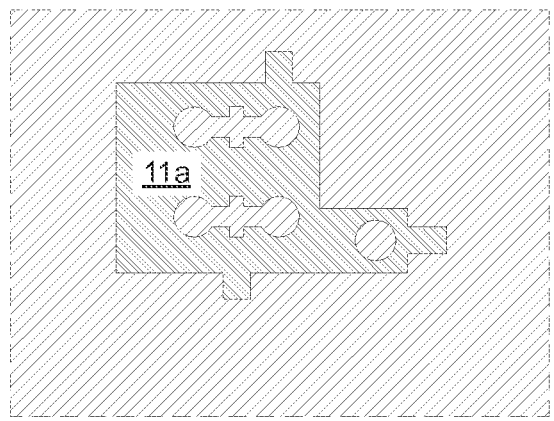
Figure 2E:
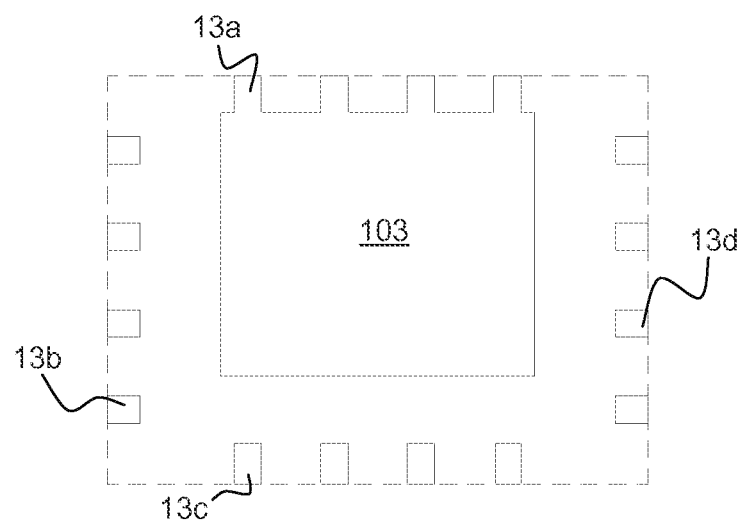
Figures 1, 4F:
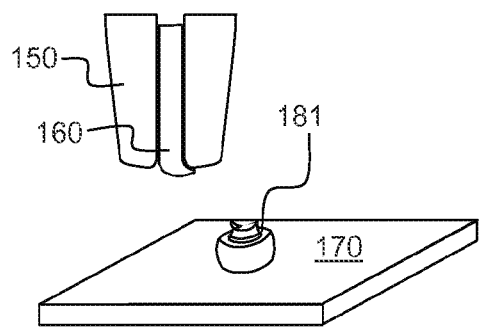
Figures 2, 4F:
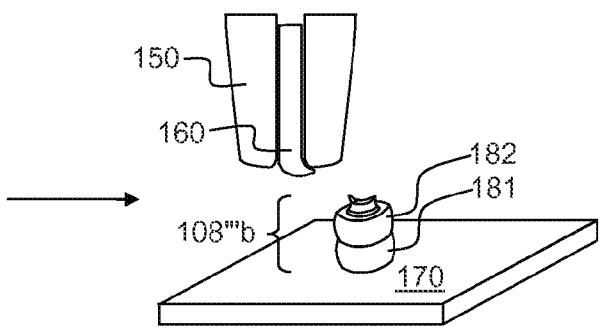

FIGS. 4F-1 to 4F-2 show a method of forming the interconnection structure 108'''*b* by ball bonding techniques. Firstly, a metal wire 160 is fed in to a capillary 150. The metal wire is melted at the tip of the capillary 150, for example by oxy-hydrogen flame or a high-voltage electric charge, thus the tip of the wire forms into a ball because of the surface tension of the molten metal. The ball is quickly solidified as a standard metal ball 181 and is released on a bonding pad 170 (such as third electrode and fourth electrode of the chip). As shown in FIG. 4F-2, the long interconnection structure 108'''*b* is formed as a second metal ball 180 is formed and stacked on the first metal ball 181. FIG. 4F-2 shows an example of forming an interconnection structure 108'''*b* with only two metal balls formed. However, there are more than 2 metal balls maybe needed depending on the height of the interconnection structure 108'''*b*, which can be adjusted by number of the metal balls stacked and the diameter of each metal ball. The height of the interconnection structure is approximately equal to number N of ball×diameter Φ of ball, and moreover, the diameter Φ of ball can be further adjusted by the diameter r of the metal wire 160.

The metal ball 181 can be used as the interconnection structure 108"*a* formed in the third electrode 108*a* as shown in FIG. 4E and a stack of metal balls 181 can be used as the interconnection structure 108'''*b* formed on the fourth electrode 108*b*. The interconnection structure 108"*a* and the interconnection structure 108'''*b* with different height can be made with the bonding ball technique as described above at the same time if the interconnection structures 108"*a* and 108'''*b* are made of the same material. Alternatively, the interconnection structure 108'''*b* can be a cylindrical bump, which is longer than the interconnection structure 108"*a*, directly formed on the fourth electrode 108*b*.

The interconnection structure 108'''*b* is relatively long, therefore if it is made of solder material containing lead and tin, it is easily broken causing the disconnection of the current path. Therefore, the interconnection structures 108"*a* and 108'''*b* are preferably made of copper or gold and the like, and the interconnection structures 108'''*b* and 108"*a* are attached on the inner pin 104*a* and the main plate portion 107*a* by a binder coated on the top surface of the inner pin 104*a* and the main plate portion 107*a* respectively.

Figure 3E:
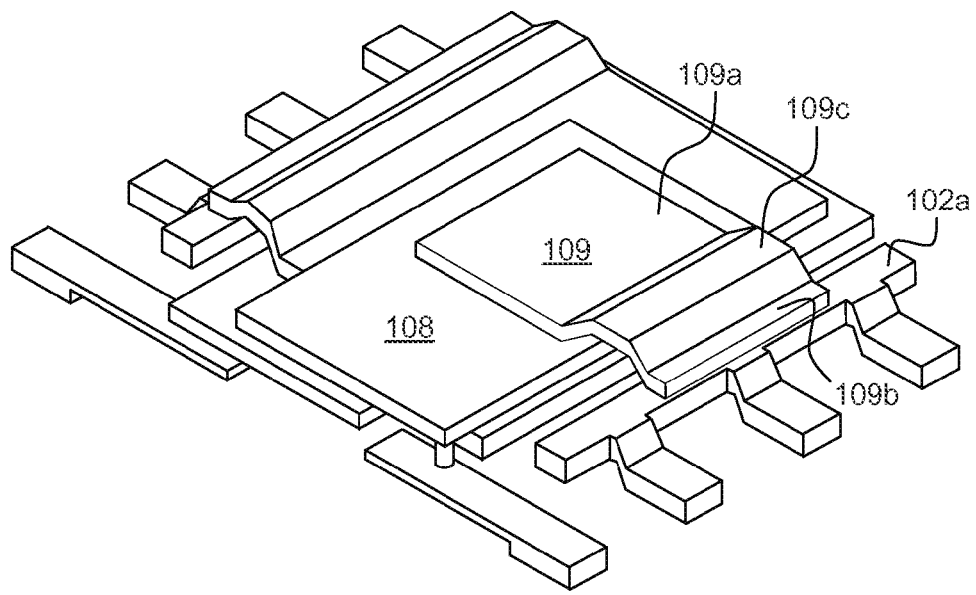

Referring to FIG. 3E, a binder (not shown) is coated on the top surface of the bonding strip 102*a* of the second pin 102 and the back metal layer 108*c* of the second chip 108, and then a second interconnecting plate 109 is attached on the back metal layer 108*c* and the bonding strip 102*a*. The second interconnecting plate 109 includes a bridge portion 109*c*, and a main plate portion 109*a* and a sub-plate portion 109*b* located at the two opposite longer sides of the bridge portion 109*c*, where the main plate portion 109*a* is attached on the second chip 108 with the bottom surface of the main plate portion 109*a* connected to the back metal layer 108*c* through the binder and the sub-plate portion 109*b* is attached on the bonding strip 102*a* with the bottom surface of the sub-plate portion 109*b* connected to the top surface of the bonding strip 102*a* through the binder. The main plate portion 109*a* and the sub-plate portion 109*b* with the bridge portion 109*c* form the step structures in order to attach to the second chip 108 and the bonding strip 102*a* respectively.

Figure 3F:
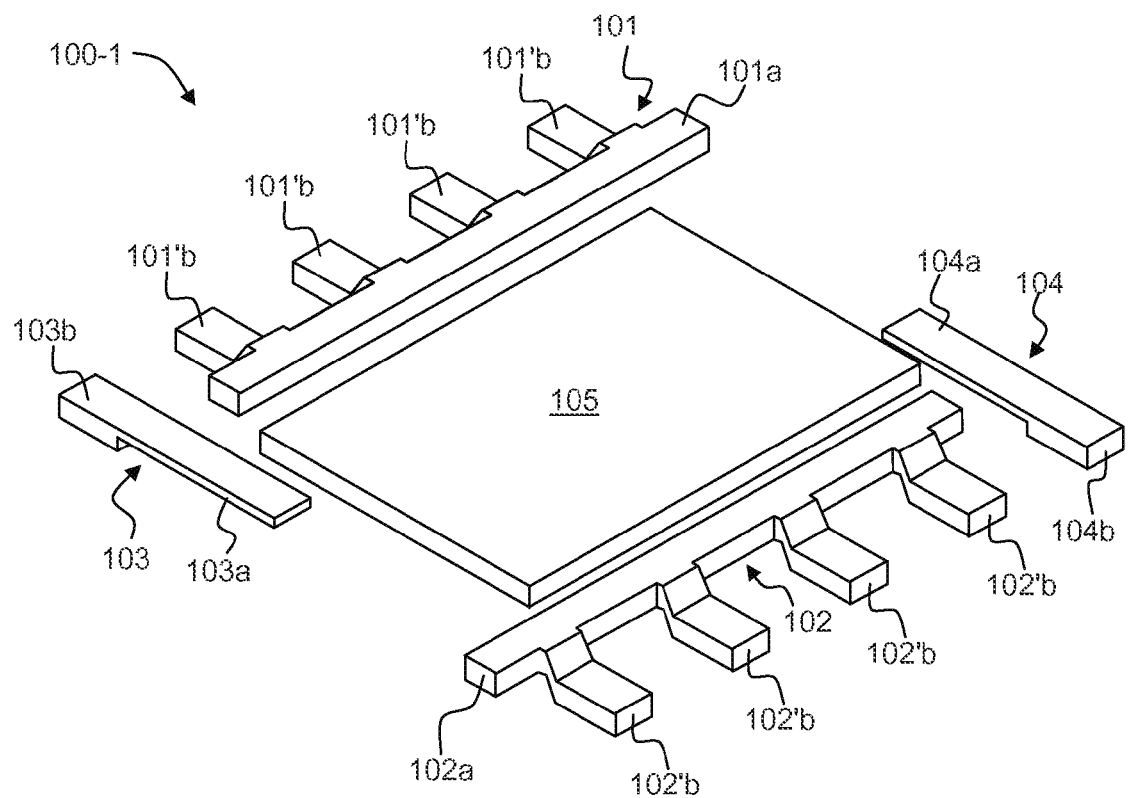
FIG. 3F and FIG. 3G are schematic diagrams illustrating the alternative structure of the lead frame and the corresponding stacked dual-ship packaging structure.
Figure 3G:
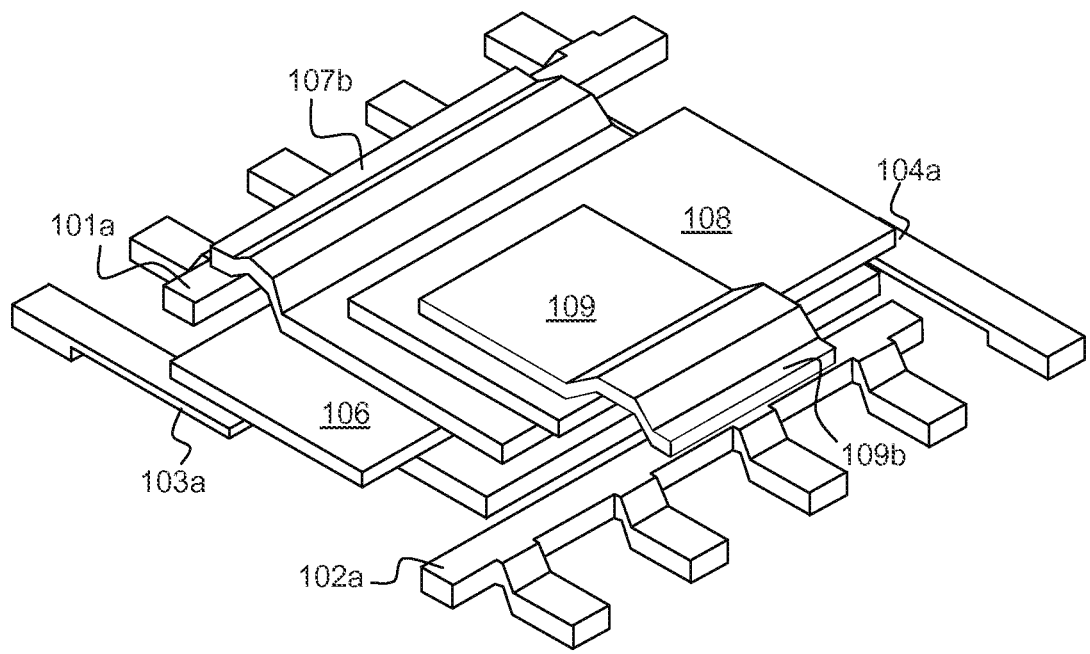

In the embodiment shown in FIGS. 3A-3E, both the third pin and the fourth pin are arranged at the rear side of the base and extend along the direction parallel to the rear side edge of the base in two opposite sides of the center line of the base respectively. In an alternative embodiment, as shown in FIGS. 3F and 3G, the third pin 103 is arranged at the rear side and extends along the direction parallel to rear side of the base and the fourth pin 104 is arranged at the front side and extends along the direction parallel to the front side of the base respectively in two opposite sides of the center line of the base respectively.

Figure 5A:
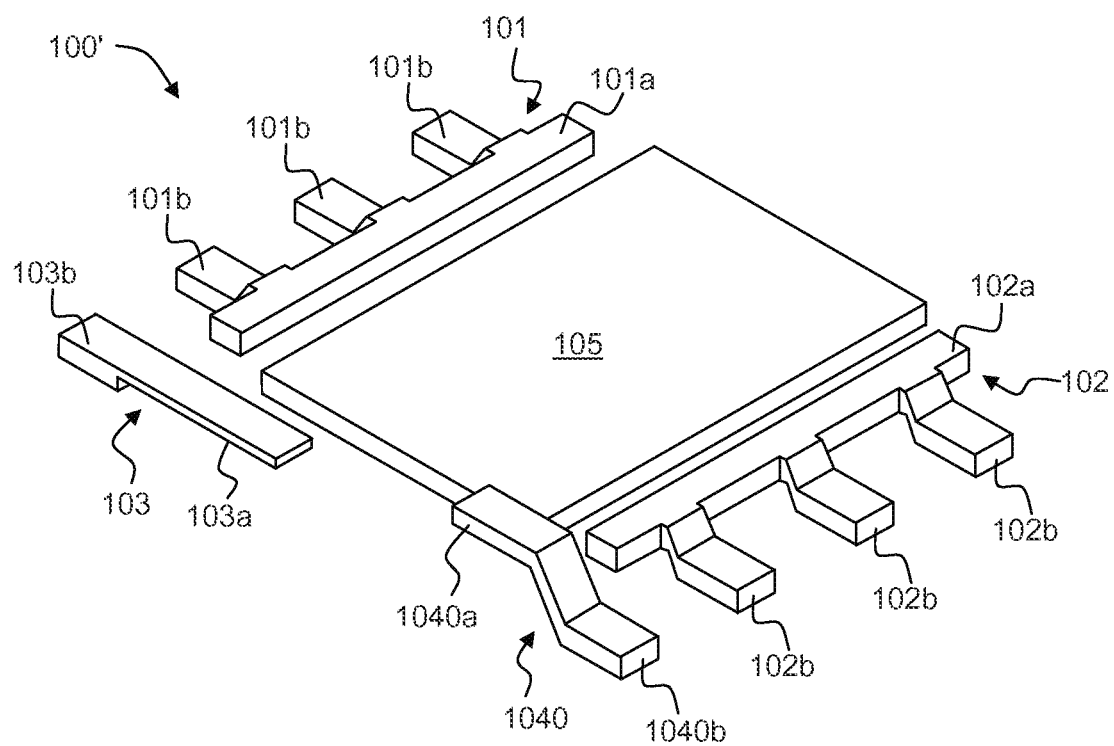
FIG. 5A to FIG. 5C are schematic diagrams illustrating an alternative process of preparing the stacked dual-chip semiconductor device.
Figure 5B:
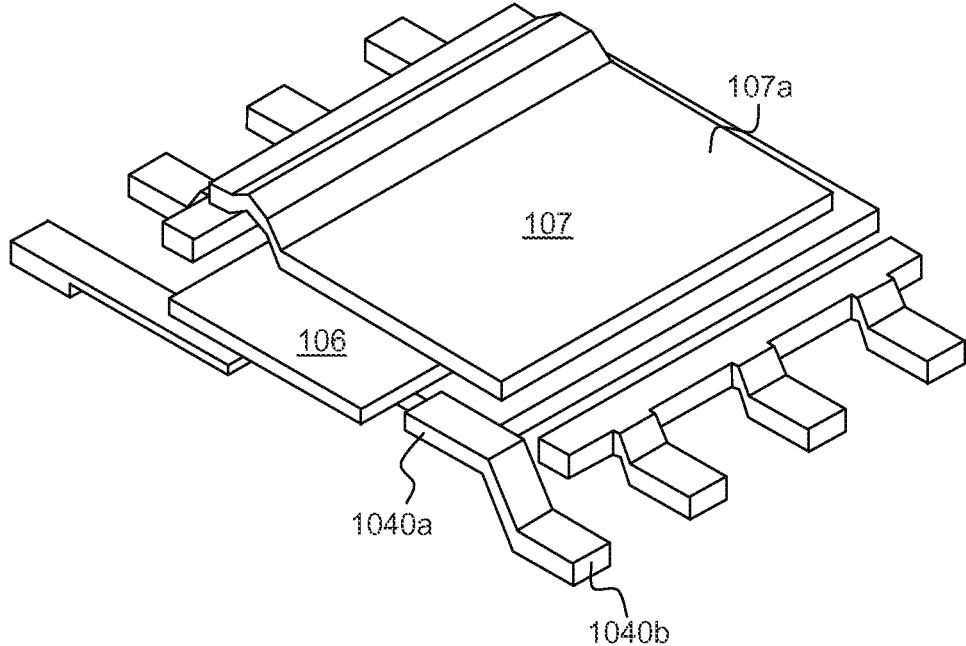
Figure 5C:
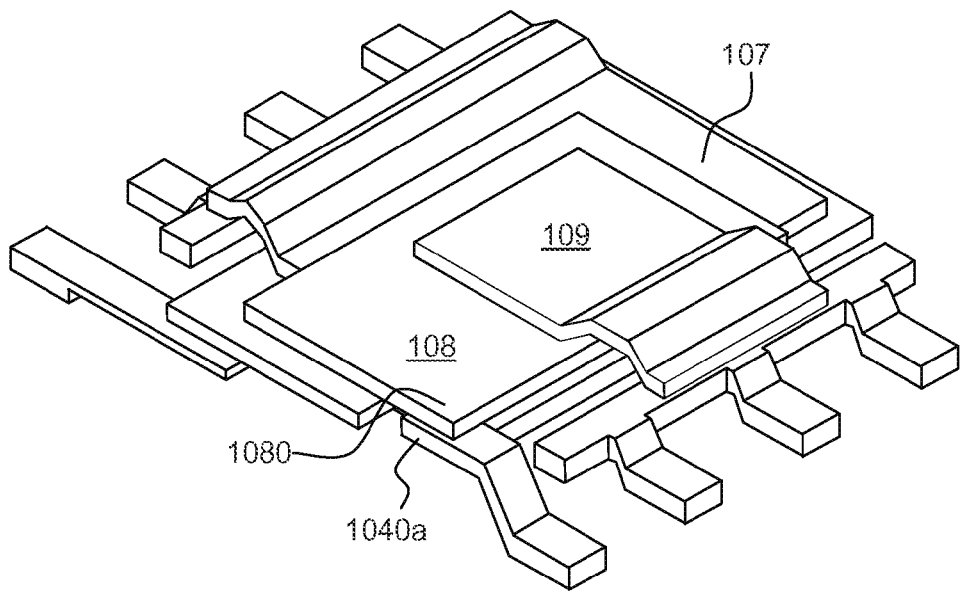
Figure 6A:
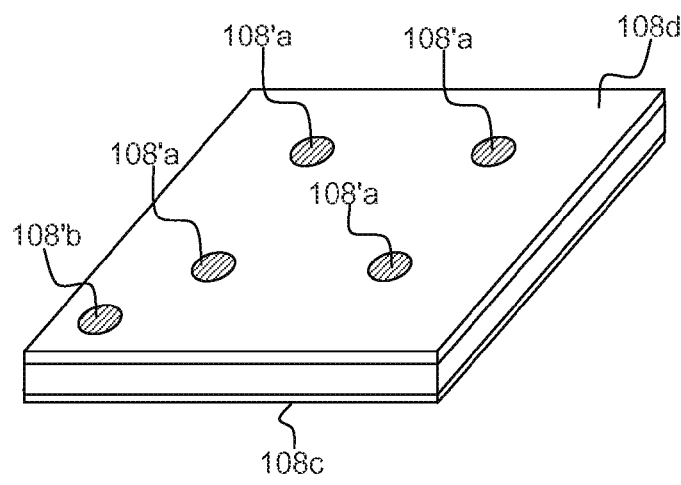
FIG. 6A to FIG. 6B are schematic diagrams of the second chip with the interconnection structures and the plastic package layer.
Figure 6B:
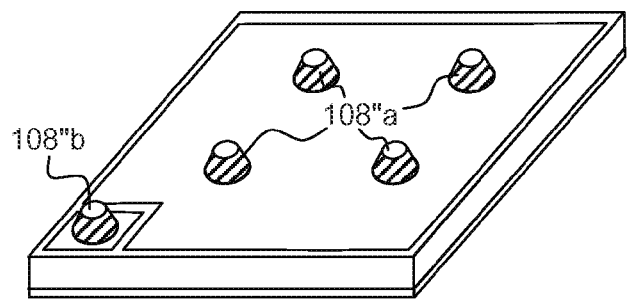

Referring to FIG. 5A, the lead frame 100' has a similar structure as the lead frame 100 of FIG. 3A excepting the structure of the fourth pin 104. The fourth pin 1040 of the lead frame 100' includes an outer pin 1040*b* and an inner pin 1040*a* that transversely extends along the rear side edge of the base 105 toward the third pin 103. The inner pin 1040*a* is located in a plane higher than that of the outer pin 1040*b* so that the top surfaces of the inner pin 1040*a* and the main plate portion 107*a* of the first interconnecting plate 107 are coplanar after the first interconnecting plate 107 is attached on the second chip 108 as shown in FIG. 5B. As a result, the interconnection structures 108'*b* and 108"*b* with same length are formed on the third and fourth electrodes 108*a*, 108*b* of the second chip 108 as shown in FIGS. 6A and 6B. In FIG. 5C, after the second chip 108 is flipped and attached on the interconnecting plate 107, the fourth electrode 108*b* is overlapped with the inner pin 1040*a* defining the overlapping area 1080 in the second chip 108.

Figure 5D:
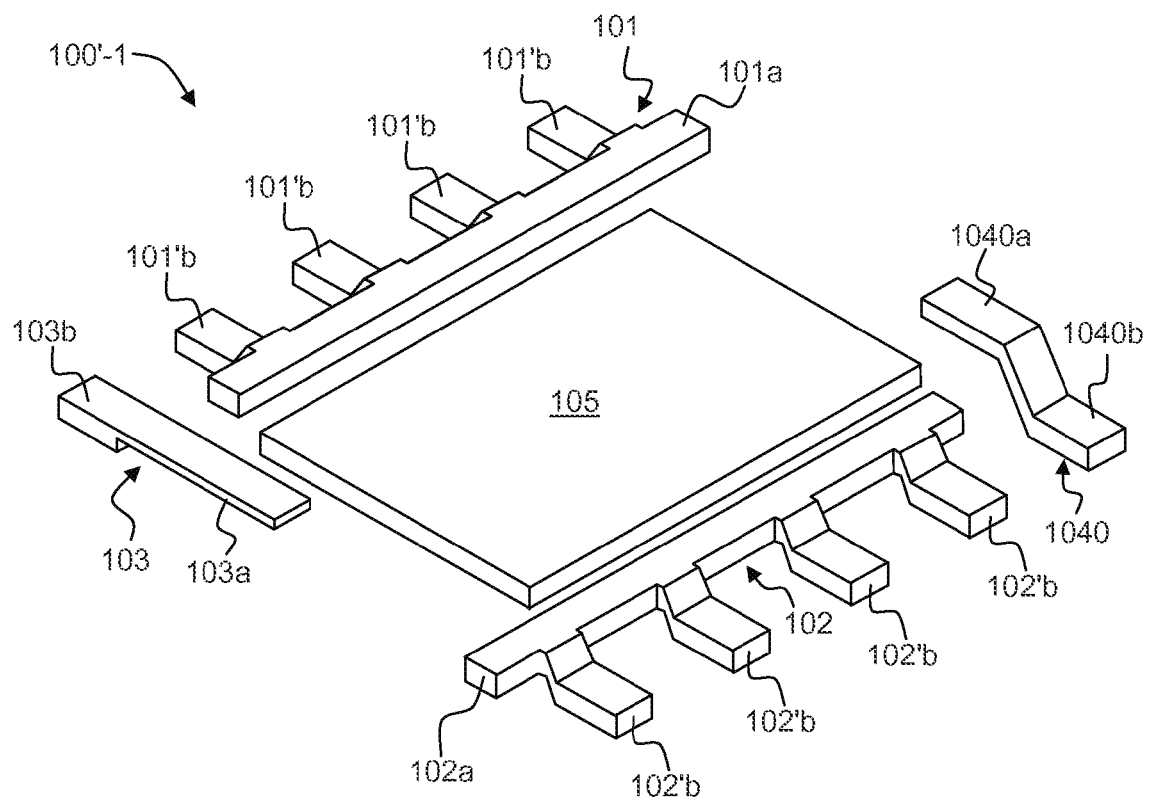
FIG. 5D and FIG. 5E are schematic diagrams illustrating the alternative structure of the lead frame and the corresponding stacked dual-ship packaging structure.
Figure 5E:
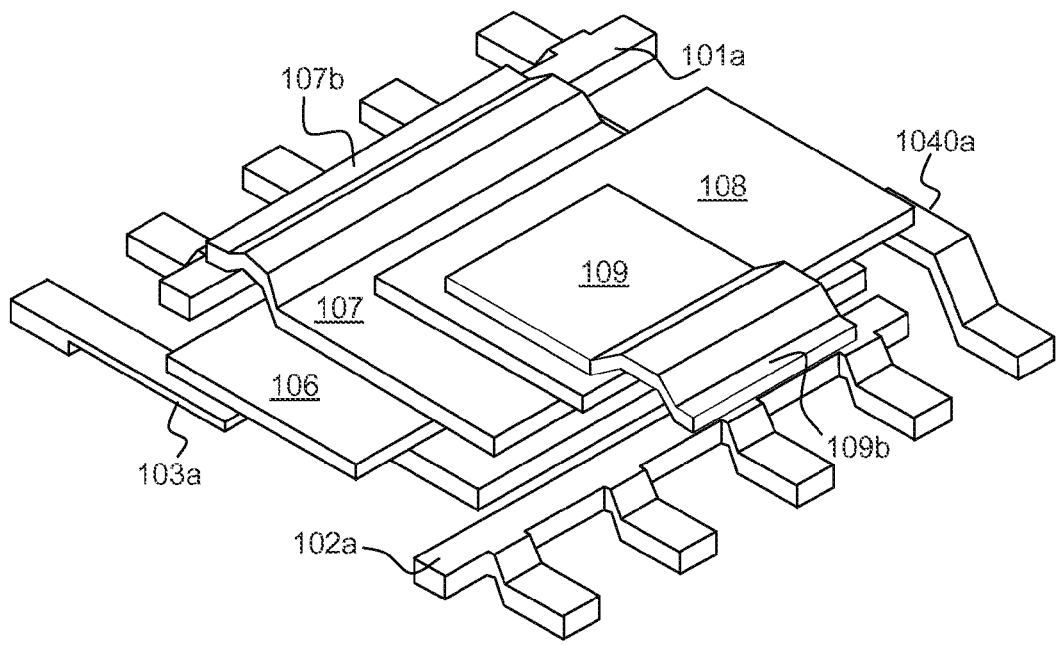

In the embodiment shown in FIGS. 5A-5C, both the third pin and the fourth pin are arranged at the rear side of the base and extend along the direction parallel to the rear side edge of the base in two opposite sides of the center line of the base respectively. In an alternative embodiment, as shown in FIGS. 5D and 5E, the third pin 103 is arranged at the rear side and extends along the direction parallel to rear side of the base and the fourth pin 1040 is arranged at the front side and extends along the direction parallel to the front side of the base respectively in two opposite sides of the center line of the base respectively.

In FIG. 6A, the plurality of interconnection structures 108'*a* are formed on the third electrode 108*a* at the front surface of the second chip 108 and one interconnection structure 108'*b* is formed on the fourth electrode 108*b*. A plastic package layer 108*d* is formed at the front surface of the second chip 108 and only surrounds the side wall of the interconnection structures 108'*a* and 108'*b* but not covers them completely so that both the interconnection structures 108'*a* and 108'*b* expose out from the plastic package layer 108*d* as the contact terminals. Alternatively, in FIG. 6B, the plurality of interconnection structures 108"*a* are formed on the third electrode 108*a* and interconnection structure 108"*b* is formed on the fourth electrode 108*b*, and there is no plastic package layer formed at the front surface of the second chip 108. The interconnection structures 108'*a*, 108'*b*, 108"*a* and 108"*b* can be cylindrical, spherical or wedge-shaped metal bumps (such as Au and Cu), or common solder balls and the like.

Figure 7A:
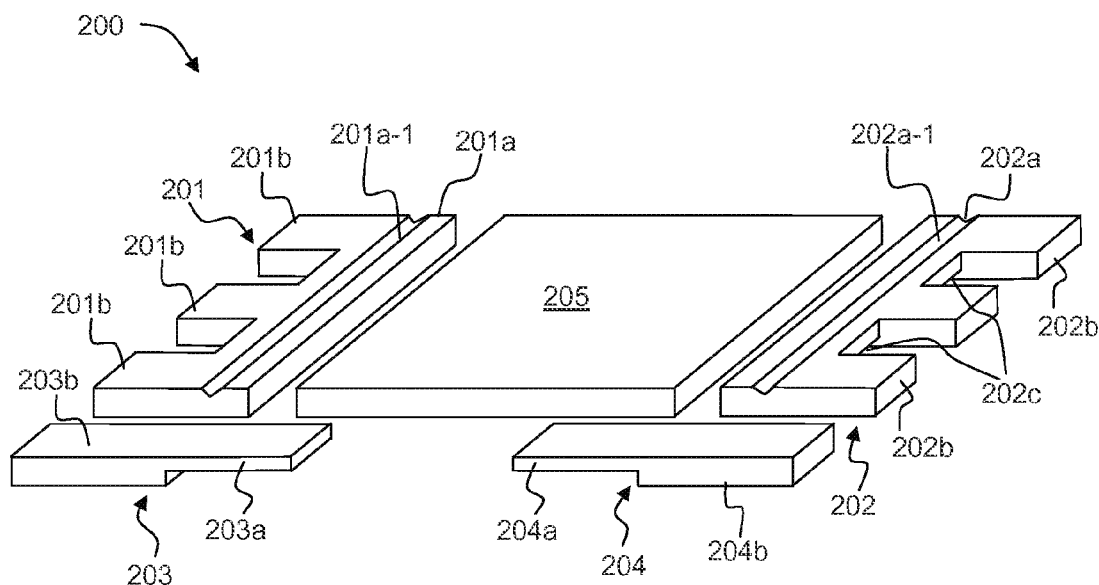
FIG. 7A to FIG. 8B are schematic diagrams illustrating preparation methods of stacked dual-chip semiconductor device with alternative first and second interconnecting plates and the first and second pins including V-shaped groove.

Referring to FIG. 7A, the lead frame 200 has a similar structure as the lead frame 100 shown in FIG. 3A excepting that the bonding strip 201*a* and the outer pin 201*b* of the first pin 201 are coplanar, and the bonding strip 202*a* and the outer pin 202*b* of the second pin 202 are also coplanar. In addition, a groove 201*a*-1 extending along the direction parallel to the left side edge of the base 205 is formed on the top surface of the bonding strip 201*a*, and a groove 202*a*-1 extending along the direction parallel to the right side edge of the base 205 is also formed on the top surface of the bonding strip 202*a*. In one embodiment, the grooves 201*a*-1 and 202*a*-1 are V-shaped.

Figure 7B:
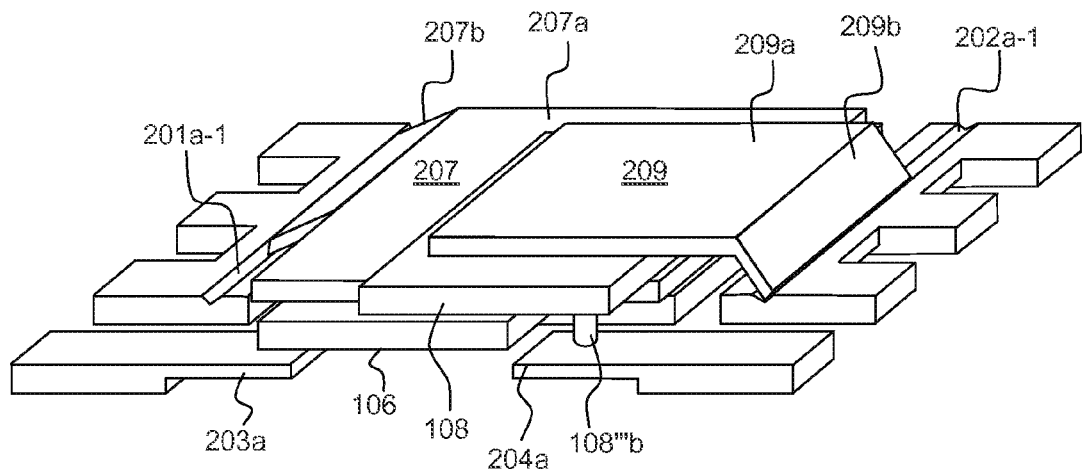
Figure 10A:
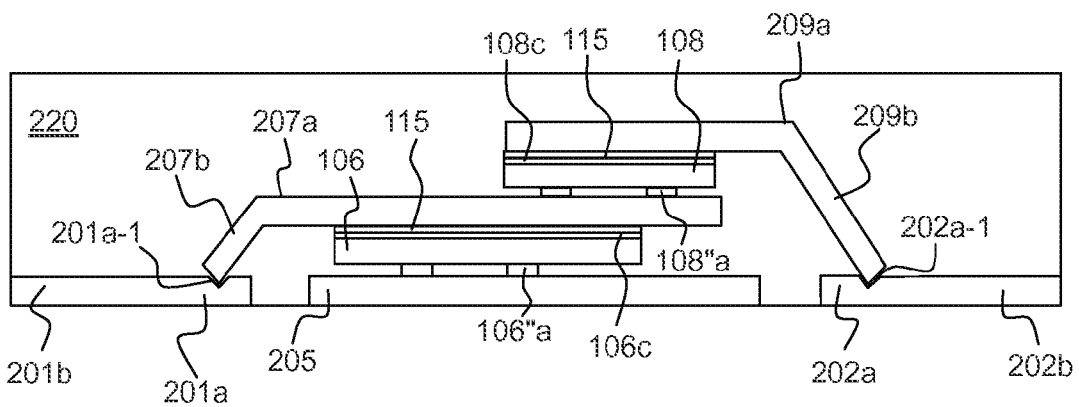
FIG. 10A is a cross-sectional diagram of a complete package of the stacked dual-chip semiconductor device of FIG. 7B
Figure 10B:
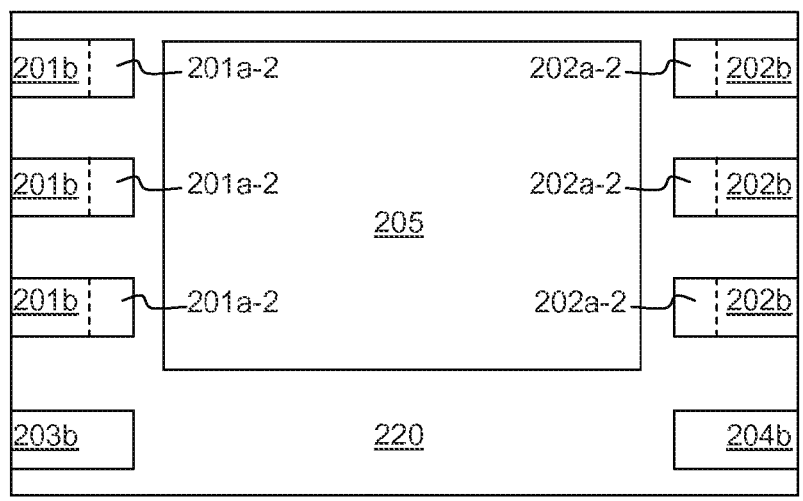
FIG. 10B is a bottom view of the complete package shown in FIG. 10A.

In some embodiments, grooves 202*c* for locking molding are etched or pressed on the lower surface of the bonding strip 202*a* of the second pin 202 as shown in FIG. 7A and divide the lower surface of the bonding strip 202*a* into a plurality of separated areas 202*a*-2 in the same number as the external pins 202*b* (as shown in FIG. 10B). The grooves 202*c* may be formed in areas between the outer pin 202*b* so that each area 202*a*-2 is fused with the lower surface of the outer pin 202*b* into one surface. As shown in FIG. 10B, the first pin 201 may have the similar structure as well. In FIG. 7B, the difference between the first interconnecting plate 207 and the first interconnecting plate 107 in FIG. 3E is that the main plate portion 207*a* of the first interconnecting plate 207 is connected with a holding plate 207*b* slanting downward with one end of the holding plate 207*b* being connected to one end of the main plate portion 207*a* and another end of the holding plate 207*b* being embedded into the groove 201*a*-1 of the bonding strip 201*a*. Similarly, the difference between the second interconnecting plate 209 and the second interconnecting plate 109 in FIG. 3E is that the main plate portion 209*a* of the second interconnecting plate 209 is connected with a holding plate 209*b* slanting downward with one end of the holding plate 209*b* being connected to one end of the main plate portion 209*a* and another end of the holding plate 209*b* being embedded into the groove 202*a*-1 of the bonding strip 202*a*. Typically, conductive binders are filled into the grooves 201*a*-1 and 202*a*-1 to increase the conductive capability and mechanical connection strength between the first interconnecting plate 207 and the bonding strip 201*a* and between the second interconnecting plate 209 and the bonding strip 202*a* respectively.

Figure 8A:
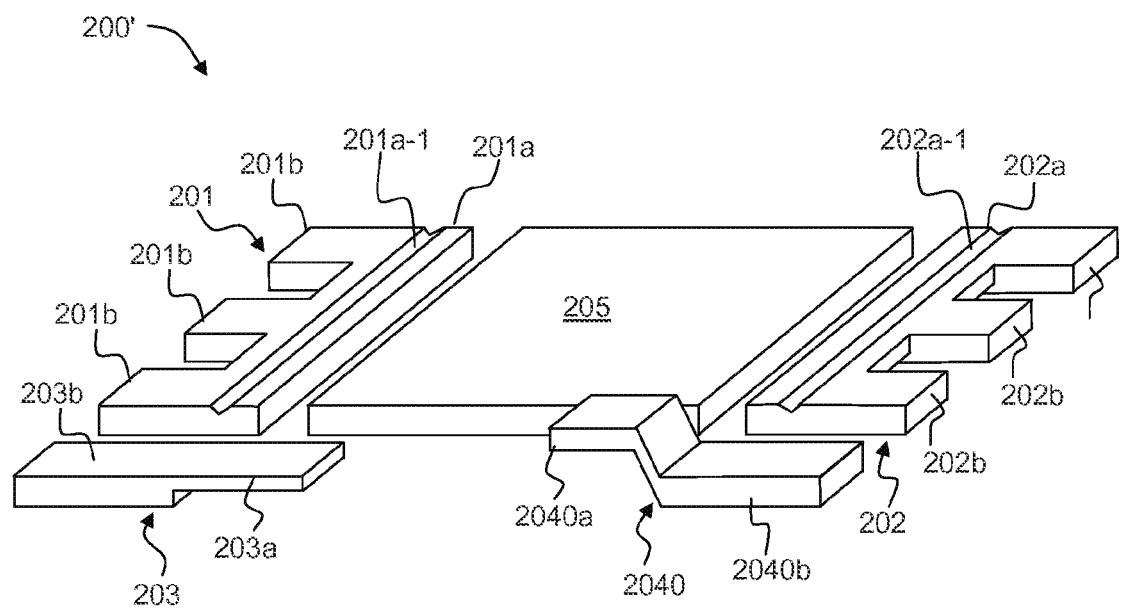
Figure 8B:
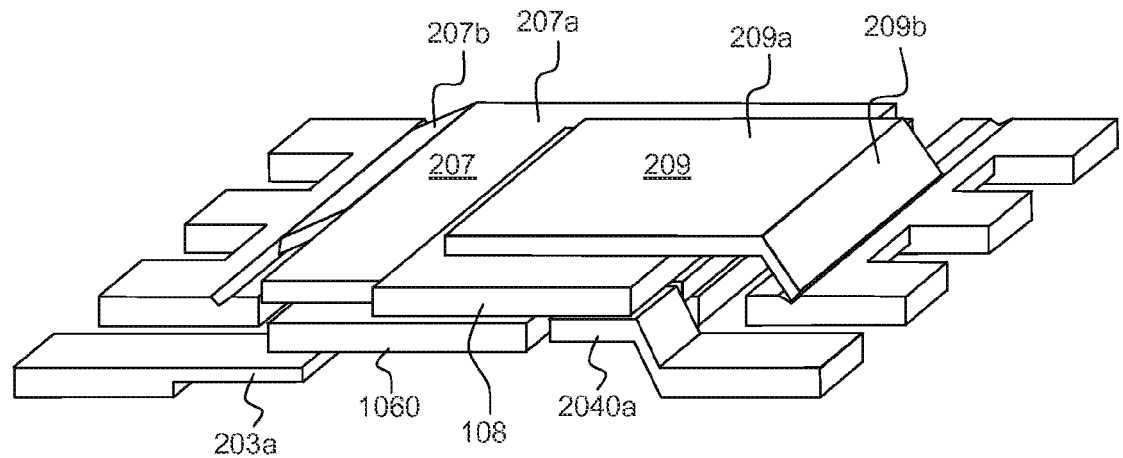

Referring to FIG. 8A, the main difference between the lead frame 200' and the lead frame 200 as shown in FIG. 7A is that the structure of the fourth pin 2040 of the lead frame 200' includes an outer pin 2040*b* and an inner pin 2040*a*, where the inner pin 2040*a* transversely extends along the direction parallel to the rear side edge of the base 205. The plane of inner pin 2040*a* is higher than that of the outer pin 2040*b* so that the top surface of the inner pin 2040*a* is coplanar with the top surface of the main plate portion 207*a* of the first interconnecting plate 207 after the first interconnecting plate 207 is attached on the first chip 106. In FIG. 8B, after the second chip 108 is flipped and attached on the main plate portion 207*a* of the first interconnecting plate 207, the second chip 108 is partially overlapped with and connected to the inner pin 2040*a* of the fourth pin 2040 defining an overlapping area 1080 in the second chip 108.

FIG. 9 is a cross-sectional diagram illustrating a package structure of the device shown in FIG. 3E. As shown in FIG. 9, a plastic package body 120 is formed to encapsulate the first chip 106, the second chip 108, the first interconnecting plate 107, the second interconnecting plate 109, interconnection structures 106"*a*, 106"*b*, 108"*a* and 108"*b* and a portion of lead frame 100. The plastic package body also covers portions of the first pin 101, the second pin 102, the third pin 103, the fourth pin 104 and the base 105 with the back surface of the base 105 and the bottom surface of the outer pin 101'*b*, 103*b*, 104*b* and 102'*b* exposing out from the plastic package body 120. If the plastic package layer 106*d* is previously formed to cover the front of the first chip 106 (as shown FIG. 4B), plastic package layer 106*d* will cover the interconnection structures 106'*a* and 106'*b*. Similarly, if the plastic package layer 108*d* is previously formed to cover the front of the second chip 108 (as shown in FIG. 6A) and second chip 108 is flipped and attached on the top surface of the inner pin 104*0a* of the lead frame 100' as shown in FIG. 5C, plastic package layer 108*d* will cover the interconnection structures 108'*a* and 108'*b*.

Figure 10C:
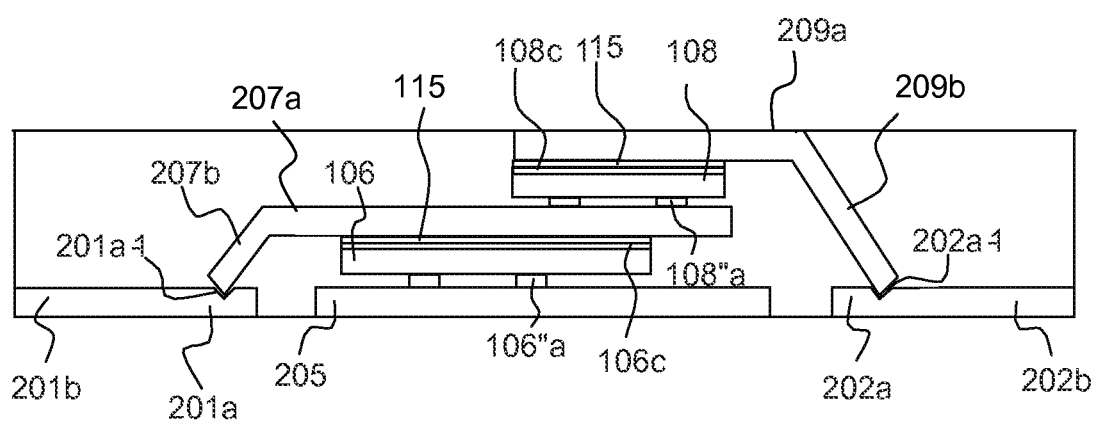
FIG. 10C is a cross-sectional diagram of a complete package of an alternative stacked dual-chip semiconductor device.

FIG. 10A is a cross-sectional diagram of a package structure of the device shown in FIG. 7B, and FIG. 10B is a bottom view of the package structure of FIG. 10A. As shown in FIG. 10A, a plastic package body 220 is formed to encapsulating the first chip 106, the second chip 108, the first interconnecting plate 207, the second interconnecting plate 209, the interconnection structures 106"*a*, 106"*b*, 108"*a* and 108"*b* and a portion of lead frame 200. The plastic package body also covers a portion of the first pin 201, the second pin 202, the third pin 203, the fourth pin 204 and the base 205 with the back surface of the base 205, the bottom surface of the outer pin 201*b*, 203*b*, 204*b* and 202*b*, and the area 202*a*-2 on the bottom surface of the bonding strip 202*a* and the area 201*a*-2 on the bottom surface of the bonding strip 201*a* exposing out from the plastic package body 220. Optionally, as shown in FIG. 10*c*, the upper surface of the main plate portion 209*a* of the second interconnecting plate 209 can also expose out from the plastic package material 220 for heat dissipation.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A stacked dual-chip package, comprising:
   a lead frame comprising a base, a first pin and a second pin arranged at a left side and a right side of the base, correspondingly, a third pin and a fourth pin separated from the base and arranged at a rear side or a front side of the base adjacent to the left side of the base and to the right side of the base, correspondingly, wherein the first pin comprises a bonding strip extending along a direction parallel to the left side of the base and the second pin comprises a bonding strip extending along a direction parallel to the right side of the base;
   a first chip comprising a first electrode and a second electrode at its front surface and a back metal layer formed on its back surface, wherein the first chip is flipped and attached on a top surface of the base such that the second electrode of the first chip is overlapped with a portion of the third pin and is connected to the third pin while the first electrode is connected to the front surface of the base;
   a first interconnecting plate comprising a main plate portion, the first interconnecting plate connects the back metal layer of the first chip to the bonding strip of the first pin with the main plate portion of the first interconnecting plate located on the first chip;
   a second chip comprising a third electrode and a fourth electrode on its front surface and a back metal layer on its back surface, wherein the second chip is flipped and attached on the main plate portion of the first interconnecting plate such that the fourth electrode is overlapped with a portion of the fourth pin and is connected to the fourth pin through a stack of metal balls;

a second interconnecting plate comprising a main plate portion, the second interconnecting plate connects the back metal layer of the second chip to the bonding strip of the second pin with the main plate portion of the second interconnecting plate located on the second chip.

2. The stacked dual-chip package of claim 1, wherein each of the third pin and the fourth pin includes an outer pin and an inner pin extending along a direction parallel to a front side or to a rear side of the base with the inner pin close to a center line between the left side and the right side of the base respectively, and wherein the second electrode of the first chip is overlapped with and connected to the inner pin of the third pin through an interconnection structure formed on the second electrode and the fourth electrode of the second chip is overlapped with and is connected to the inner pin of the fourth pin through the stack of metal balls formed on the fourth electrode, wherein a top surface of each inner pin of the third pin and the fourth pin is coplanar with the front surface of the base and wherein the stack of metal balls interconnection structure formed on the fourth electrode is longer than an interconnection structure formed on the third electrode.

3. The stacked dual-chip package of claim 1, wherein each of the third pin and the fourth pin includes an outer pin and an inner pin extending along the direction parallel to a rear side or a front side of the base with the inner pin close to the center line between the left side and the right side of the base, wherein the inner pin of the fourth pin is located in a plane higher than that of the outer pin, such that a top surface of the inner pin of the fourth pin is coplanar with a top surface of the main plate portion of the first interconnecting plate, wherein the second electrode of the first chip is overlapped with and is connected to the inner pin of the third pin through an interconnection structure formed on the second electrode and the fourth electrode of the second chip is overlapped with and is connected to the inner pin of the fourth pin through an interconnection structure formed on the fourth electrode.

4. The stacked dual-chip package of claim 1, wherein the first chip further comprises a plastic package layer covering the front surface of the first chip and surrounding side walls of a plurality of interconnection structures formed on the first electrode and the second electrode so that the interconnection structures expose out from the plastic package layer.

5. The stacked dual-chip package of claim 1, wherein the first chip is not overlapped with the fourth pin, and the second chip is not overlapped with the third pin.

6. The stacked dual-chip package of claim 1, wherein the second chip further comprises a plastic package layer covering the front surface of the second chip and surrounding the side wall of the interconnection structures formed on the third electrode and the fourth electrode so that the interconnection structures expose out from the plastic package layer.

7. The stacked dual-chip package of claim 1, wherein the first interconnecting plate further comprises a holding plate connecting with the main plate portion at one end and slanting downward and another end of the holding plate is embedded into a groove formed on the top surface of the bonding strip of the first pin, and the second interconnecting plate further comprises a holding plate connected with the main plate portion at one end and slanting downward and another end of the holding plate is embedded into a groove formed on the top surface of the bonding strip of the second pin.

8. The stacked dual-chip package of claim 1 further comprises a plastic package body encapsulating the first chip, the second chip, the first interconnecting plate, the second interconnecting plate and the stack of metal balls interconnection structures and a portion of the lead frame with a bottom surface of the base is exposed from the plastic package body.

9. The stacked dual-chip package of claim 1, wherein the stack of metal balls comprises copper metal balls or gold balls.

10. The stacked dual-chip package of claim 9, wherein the stack of metal balls is connected to the fourth pin by a binder coated on a top surface of the fourth pin.

11. The stacked dual-chip package of claim 1, wherein the third electrode is attached onto a top surface of the first interconnecting plate through an interconnection structure comprising a plurality of metal balls formed on the third electrode.

12. The stacked dual-chip package of claim 11, wherein the metal balls formed on the third electrode and the stack metal balls formed on the fourth electrode are formed with the same material.

13. A method for forming a stacked dual-chip package comprising the steps of: providing a lead frame, the lead frame comprises a base, a first pin and a second pin formed at a left side and a right side of the base respectively and a third pin and a fourth pin formed at a rear side or a front side of the base, the first pin extends along a direction parallel to the left side of the base and the second pin extends along a direction parallel to the left side of the base;

flipping and attaching a first chip on the base, the first chip comprises a first electrode and a second electrode formed on its front surface and a back metal layer formed on its back surface, and a plurality of interconnection structures formed on the first electrode and second electrode, wherein the first chip is partially overlapped with the third pin defining an overlapping area on the first chip, interconnection structures formed on a first electrode are connected to a top surface of the base, and the second electrode of the first chip is connected to the third pin through an interconnection structure formed on the second electrode;

providing a first interconnecting plate connecting the back metal layer of the first chip to a bonding strip of the first pin, the first interconnecting plate comprising a main plate portion attached on the back metal layer of the first chip; flipping and attaching a second chip on the first interconnecting plate, the second chip comprises a third electrode and a fourth electrode formed on its front surface, a back metal layer formed on its back surface, and a plurality of interconnection structures are formed on the third electrode and fourth electrode, wherein the second chip is partially overlapped with the fourth pin defining an overlapping area on the second chip, an interconnection structure formed on the third electrode at the front of the second chip is connected to a top surface of the first interconnecting plate, the fourth electrode formed at the front of the second chip is connected to the fourth pin through an interconnection structure formed on the fourth pin and comprising a stack of metal balls;

providing a second interconnecting plate connecting the back metal layer of the second chip to a bonding strip of the second pin, the second interconnecting plate comprising a main plate portion attached on the back metal layer of the second chip.

14. The method of claim 13, wherein the third pin comprises an outer pin and an inner pin extending along the direction parallel to a rear side of the base with the inner pin being close to the center line between the left side and the right side of the base and overlapping with the first chip, and wherein flipping and attaching the first chip on the base comprises connecting the second electrode formed at the front surface of the overlapping area of the first chip to the inner pin of the third pin, the fourth pin comprises an outer pin and an inner pin forming a step structure, the inner pin extends along the direction parallel to the rear side or front side of the base close to the center line between the left side and the right side of the base with the top surface of the inner pin being coplanar with the top surface of a main plate portion of the first interconnecting plate and overlapping with the second chip, wherein flipping and attaching second chip on the first interconnecting plate comprises connecting the interconnection structure formed on the fourth electrode at the front surface of the overlapping area of the second chip to the inner pin of the fourth pin.

15. The method of claim 13 further comprising forming a plastic package body to encapsulate the first chip, the second chip, the first interconnecting plate, the second interconnecting plate and the interconnection structures and a part of the lead flame, with the bottom surface of the base exposed outside from the plastic package body.

16. The method of claim 13, wherein the third pin comprises an outer pin and an inner pin extending along the direction parallel to a rear side of the base with the inner pin being close to the center line between the left side and the right side of the base and overlapping with the first chip, the fourth pin comprises an outer pin and an inner pin extending along the direction parallel to the rear side or a front side of the base with the inner pin being close to the center line between the left side and the right side of the base and overlapping with the second chip, and top surfaces of the inner pins of the third pin and the fourth pin are coplanar with a top surface of the base, wherein flipping and attaching the first chip on the base comprises connecting the second electrode at the front surface of the overlapping area of the first chip to the inner pin of the third pin through the interconnection structure formed on the second electrode, and before flipping and attaching the second chip on the first interconnecting plate, forming interconnection structures on the third electrode and the fourth electrode of the second chip, wherein the interconnection structure formed on the fourth electrode is longer than the interconnection structures formed on the third electrode.

17. The method of claim 16, wherein the longer interconnection structure formed on the fourth electrode of the second chip is attached on the inner pin of the fourth pin.

18. The method of claim 16, wherein forming the stack of metal balls on the fourth electrode includes forming and stacking a series of solder balls on the fourth electrode in sequence from bottom to top.

\* \* \* \* \*